US006960810B2

(12) United States Patent
Fechner

(10) Patent No.: US 6,960,810 B2
(45) Date of Patent: Nov. 1, 2005

(54) SELF-ALIGNED BODY TIE FOR A PARTIALLY DEPLETED SOI DEVICE STRUCTURE

(75) Inventor: Paul Fechner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/158,603

(22) Filed: May 30, 2002

(65) Prior Publication Data

US 2003/0222313 A1    Dec. 4, 2003

(51) Int. Cl.[7] .............................................. H01L 27/01
(52) U.S. Cl. ...................... 257/351; 257/348; 257/349
(58) Field of Search ................................ 257/200, 347, 257/351, 510, 288, 324, 325, 296, 350, 368, 257/392, 393, 348, 349, 352, 353, 354, 524, 257/E27.112, E21.545; 438/162, 163, 151, 438/459

(56) References Cited

U.S. PATENT DOCUMENTS

| 5,405,795 | A | | 4/1995 | Beyer et al. .................. 437/41 |
| 5,489,792 | A | * | 2/1996 | Hu et al. ..................... 257/347 |
| 5,920,093 | A | | 7/1999 | Huang et al. ................ 257/347 |
| 6,124,613 | A | | 9/2000 | Kokubun .................... 257/347 |
| 6,144,072 | A | * | 11/2000 | Iwamatsu et al. ........... 257/347 |
| 6,307,237 | B1 | | 10/2001 | Erstad ........................ 257/401 |
| 6,348,714 | B1 | | 2/2002 | Lin et al. .................... 257/347 |
| 6,353,245 | B1 | | 3/2002 | Unnikrishnan .............. 257/347 |
| 6,498,371 | B1 | * | 12/2002 | Krishnan et al. ........... 257/351 |

FOREIGN PATENT DOCUMENTS

| JP | 9-246562 | 9/1997 | ......... H01L 29/786 |
| JP | 09246562 | 9/1997 | ......... H01L 29/786 |

OTHER PUBLICATIONS

Chuang, et al., SOI for Digital CMOS VLSI: Design Considerations and Advances Proceedings of the IEEE, vol. 86, No. 4, Apr. 1998.

Fechner, et al., "Radiation Hardened SOI CMOS and 1M SRAM", 1997 IEEE International SOI Conference, Sep. 30-Oct. 2, 1997, p. 172.

Fechner, et al., "SHARP Isolation Technology for Radiation Hardened Submicron CMOS SOI", Journal of Radiation Effects, Research and Engineering, vol. 13, No. 1, Jan. 1996, p. 106.

(Continued)

*Primary Examiner*—George Fourson
*Assistant Examiner*—Julio Maldonado
(74) *Attorney, Agent, or Firm*—McDonnell Boehnen Hulbert & Berghoff LLP

(57) ABSTRACT

A silicon-on-insulator (SOI) device structure 100 formed using a self-aligned body tie (SABT) process. The SABT process connects the silicon body of a partially depleted (PD) structure to a bias terminal. In addition, the SABT process creates a self-aligned area of silicon around the edge of the active areas, as defined by the standard transistor active area mask, providing an area efficient device layout. By reducing the overall gate area, the speed and yield of the device may be increased. In addition, the process flow minimizes the sensitivity of critical device parameters due to misalignment and critical dimension control. The SABT process also suppresses the parasitic gate capacitance created with standard body tie techniques.

13 Claims, 11 Drawing Sheets

OTHER PUBLICATIONS

Kang, et al., "A Novel Body-tied Silicon-On-Insulator (SOI) n-channel Metal-Oxide-Semiconductor Field-Effect Transistor with Grounded Body Electrode" ETRI Journal, vol. 17, No. 4, Jan. 1996.

Min, et al., "Partial Trench Isolated Body-tied (PTIBT) Structure for SOI Applications" IEEE International SOI Conference, Oct. 2001.

Pelloie, et al. "WP 25.2 SOI Technology Performance and Modeling" IEEE International Solid-State Circuits Conference, 1999.

"A RF Power LDMOS Device on SOI," 1999 IEEE International SOI Conference, Oct. 1999.

International Search Report for PCT/US03/16556 Mailed Oct. 13, 2003.

* cited by examiner

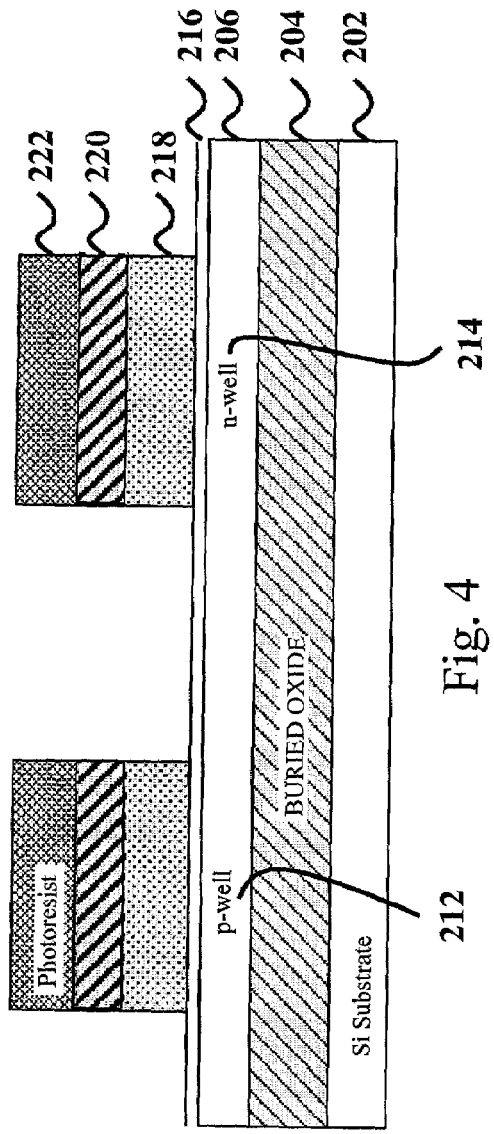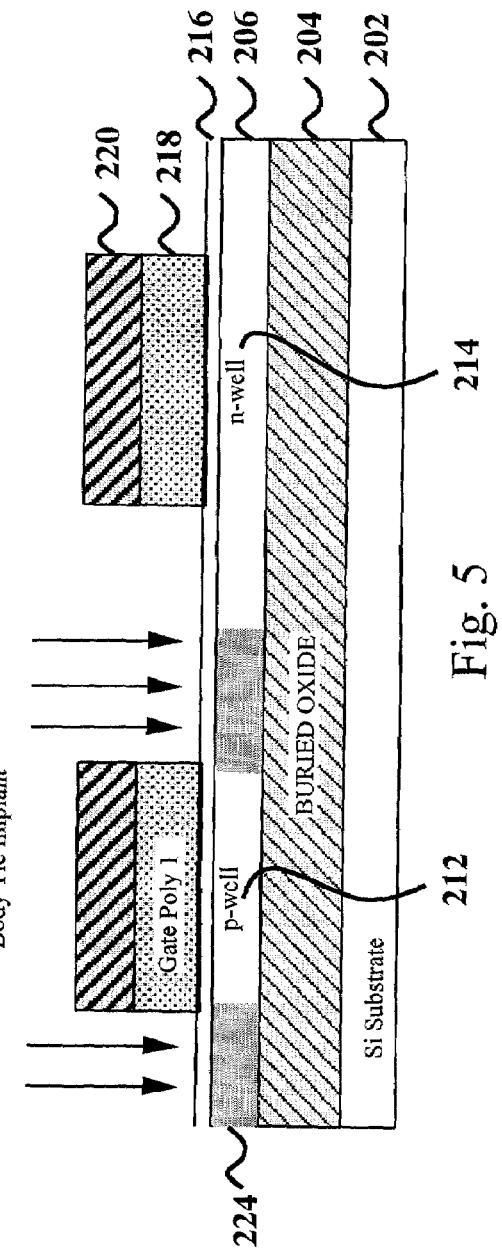
Fig. 4
Fig. 5

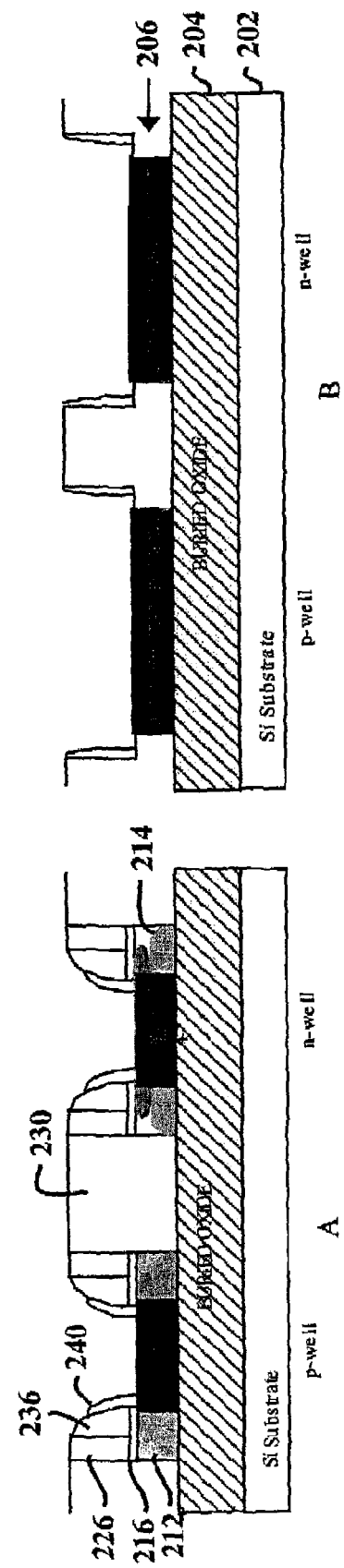

SELF-ALIGNED BODY TIE FOR A PARTIALLY DEPLETED SOI DEVICE STRUCTURE

GOVERNMENT RIGHTS

The United States Government has acquired certain rights in this invention pursuant to Contract No. DTRA 01-00-C-0017 awarded by the Defense Threat Reduction Agency.

FIELD

The present invention relates generally to device processing of Silicon-On-Insulator (SOI) wafers, and more particularly, relates to a structure and method for forming an area efficient self-aligned body tie for partially depleted SOI device structures.

BACKGROUND

SOI is a device processing technique that places an insulating layer (e.g. a buried oxide layer) over a silicon substrate, Transistors are then fabricated in a layer of silicon located on top of the insulating layer. This technique may allow circuits to operate at higher speeds and to consume less power due to reduced junction capacitance. These operational improvements make device processing on SOI the preferred method for high-performance digital systems.

Depending on the silicon thickness and the doping level, an SOI device can be manufactured as a fully or partially depleted structure. A partially depleted structure (PD) is formed in a semiconductor layer that is thick enough to ensure that the channel will not be fully depleted when the device is turned off. Fully depleted (FD) structures require ultra-thin silicon layers, which are difficult to manufacture. Because partially deleted PD structures are easier to manufacture, many SOI devices are PD structures.

However, there are operational issues with the PD structures due to the "floating-body" effect, which is much less of an issue in the FD structures. The buried oxide layer creates a node, known as the body, which is not electrically connected to a fixed potential; and thus, is described as floating. The floating body effect causes several problems, such as the kink effect, drain current overshoot, single transistor latch, and reduced drain breakdown voltage.

At least two solutions have been proposed for overcoming the floating-body effect: biasing the substrate below the buried oxide layer or biasing the body directly. Of these two solutions, biasing of the body directly seems to be the most promising. The use of an H gate or a T gate layout method has been successfully used to bias the body directly, suppressing the floating-body effect. However, these methods increase the layout area required for the device, which is a big disadvantage for large-scale integration. In addition, these methods add unwanted parasitic gate oxide capacitance to the device, which degrades performance.

Min et al. propose using a modified shallow trench isolation (STI) method for reducing the parasitic capacitance in their article "Partial Trench Isolated Body-tied (PTIBT) Structure for SOI Applications," which is fully incorporated by reference herein. However, the critical dimension and alignment associated with the additional lithography and etch steps required by this method are directly reflected in the transistor electrical width, which leads to larger design variation budgets that must be accounted for in the circuit design. This issue becomes much more critical as device specifications require smaller layouts. The cost of fabrication is significantly increased by the additional critical control of the processing steps required to minimize these effects.

Therefore, it would be desirable to bias the body of a PD SOI device structure in a manner that suppresses the floating-body effects inherent in a PD structure, while at the same time minimizing both the layout area of the device and the process complexity.

BRIEF DESCRIPTION OF THE DRAWINGS

Presently preferred embodiments are described below in conjunction with the appended drawing figures, wherein like reference numerals refer to like elements in the various figures, and wherein:

FIGS. 2–10 are cross sectional views of the SOI device structure shown in FIG. 1 during various stages of fabrication, according to an exemplary embodiment.

DETAILED DESCRIPTION

Figure 1:
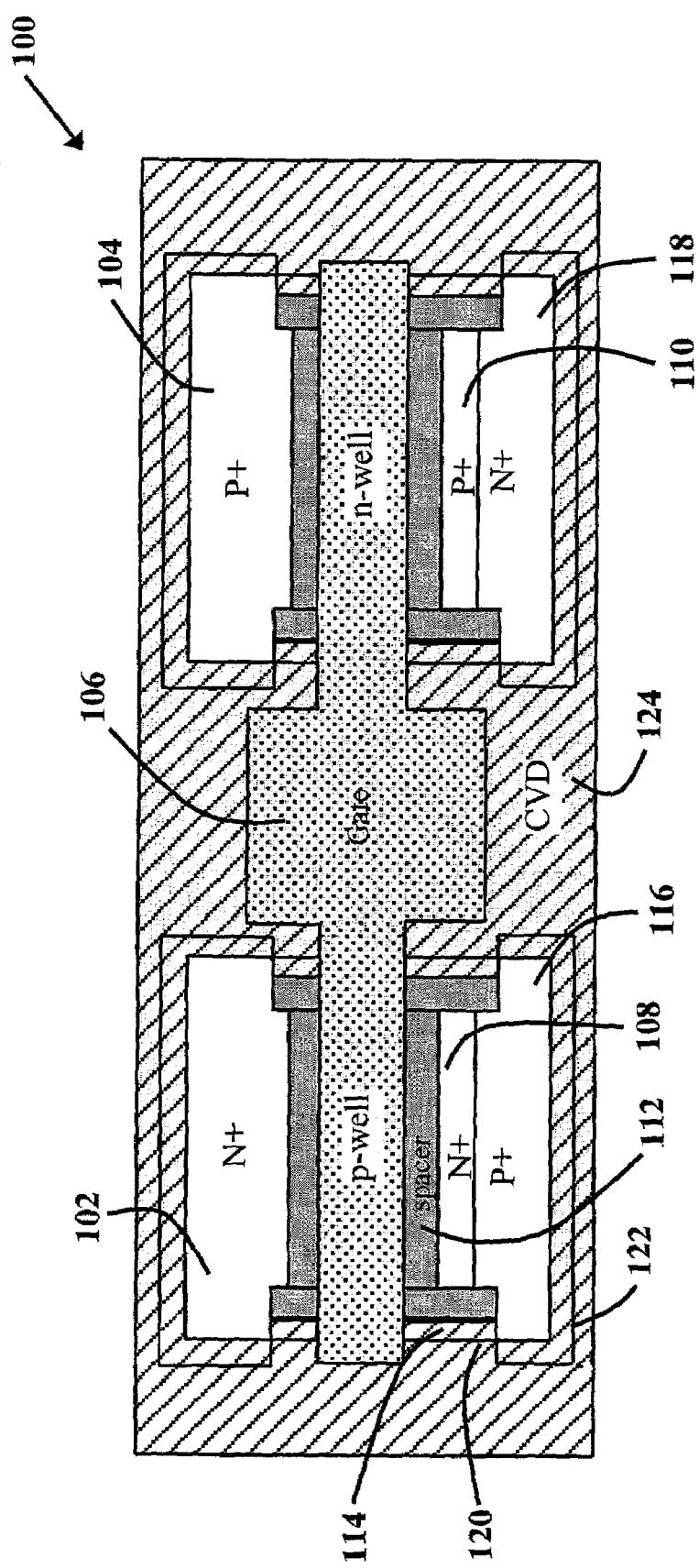
FIG. 1 is a plan view of an SOI device structure, according to an exemplary embodiment.

FIG. 1 illustrates an exemplary embodiment of a silicon-on-insulator (SOI) device structure 100 formed using a self-aligned body tie (SABT) process as described herein. The SABT process connects the silicon body of a partially depleted (PD) structure to a bias terminal. In addition, the SABT process creates a self-aligned area of silicon around the edge of the active areas, as defined by the standard transistor active area mask, providing an area efficient device layout.

The SOI device structure 100 may be formed on the active region of an SOI substrate and contain an N+ drain 102, a P+ drain 104, a gate 106, an N+ source 108, a P+ source 110, gate spacers 112, body ties 114, a P+ body contact 116, an N+ body contact 118, sidewalls 120, and body tie spacers 122. The SOI device structure 100 may include an N-channel device and a P-channel device. The N+ drain 102, the N+ source 108, and the gate 106 may define the N-channel device. The P+ drain 104, the P+ source 110, and the gate 106 may define the P-channel device.

The gate 106 may be located substantially above a p-well region of the N-channel device ("p-well region") and substantially above an n-well region of the P-channel device ("n-well region"). The gate 106 may also extend onto a surrounding field oxide layer 124 to provide interconnection between transistors and contacts.

The gate spacers 112 may be located substantially adjacent to both sides of the p-well and n-well regions of the gate 106. The N+ drain 102 and the N+ source 108 may be located substantially adjacent to the gate spacers 112 on opposite sides of the p-well region of the gate 106. The P+ drain 104 and the P+ source 110 may be located substantially adjacent to the gate spacers 112 on opposite sides of the n-well region of the gate 106. The P+ body contact 116 may be located substantially adjacent to the N+ source 108. The N+ body contact 118 may be located substantially adjacent to the P+ source 110.

The body tie spacers 122 may form substantially a "U" shape. The body tie spacers 122 may be located substantially adjacent to the body contacts 116, 118. The body ties 114 may be located substantially between sidewalls 120 and gate spacers 112. The body ties 114 may provide a conduction path from the p-well region substantially under the gate 106 to the P+ body contact 116 and a conduction path from the n-well region substantially under the gate 106 to the N+ body contact 118.

A method of fabricating the SOI device structure 100 is described as follows.

Figure 2:
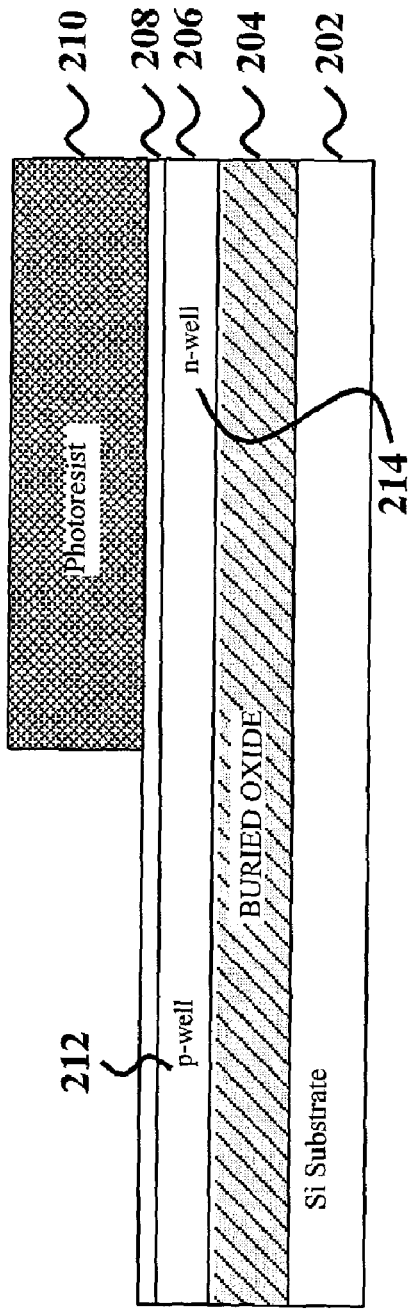

FIG. 2 shows the SOI device structure 100 during initial stages of processing according to an exemplary embodiment. A buried oxide layer 204 may be formed on a silicon substrate layer 202. A device silicon layer 206 may then be formed on the buried oxide layer 204. The buried oxide layer 204 may provide vertical isolation between the device silicon layer 206 and the silicon substrate layer 202. Alternatively, sapphire may be used instead of the buried oxide layer 204, providing a silicon-on-sapphire (SOS) device structure.

A layer of pre-gate oxide 208 may be formed on the device silicon layer 206 to serve as a protective layer. The pre-gate oxide layer 208 may be formed by oxidation. Other deposition techniques may also be used. The thickness of the pre-gate oxide layer 208 may be substantially 200 Angstroms. However, the actual thickness of the pre-gate oxide layer 208 may be more or less than 200 Angstroms.

A photoresist 210 may be placed on the pre-gate oxide layer 208 as a doping barrier. A masked p-well implant and a masked n-well implant may be performed in the device silicon layer 206 forming two distinct areas in the device silicon layer 206, the p-well region 212 and the n-well region 214. Ion implantation may be employed for both masked implants. Other doping methods that are compatible with the device silicon layer 206 may also be used. After the implants are performed, the photoresist 210 may be removed and the wafer cleaned.

Figure 3:
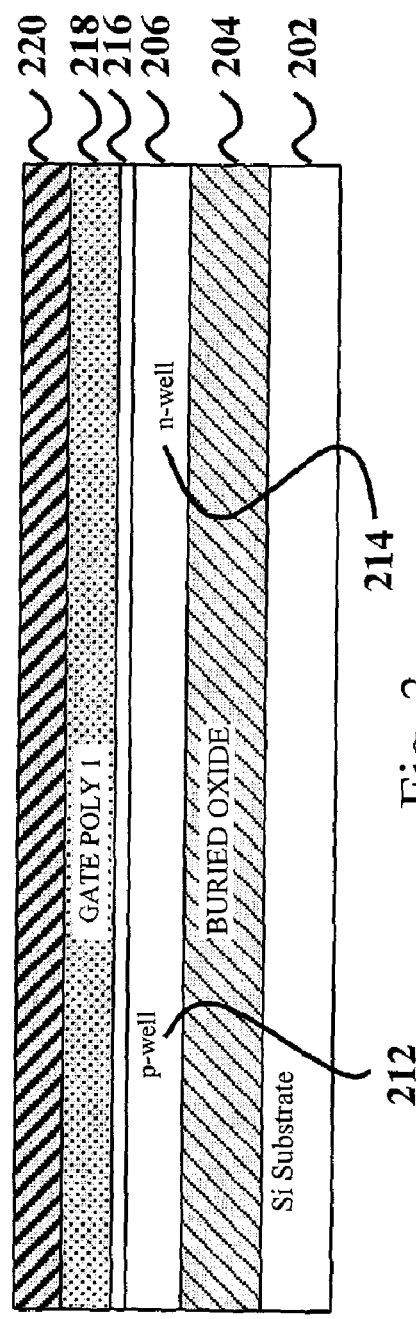

FIG. 3 shows the SOI device structure 100 during additional stages of processing according to an exemplary embodiment. The pre-gate oxide layer 208 may be removed by selective etching. A gate oxide layer 216 may be formed on the device silicon layer 206. The gate oxide layer 216 may be a nitridized gate oxide, which is used as an industry standard material for minimizing boron penetration. The gate oxide layer 216 may be thermally grown silicon nitride. Other deposition techniques may also be used. The thickness of the gate oxide layer 216 may be substantially 48 Angstroms. However, the actual thickness of the gate oxide layer 216 may be more or less than 48 Angstroms.

A layer of gate polysilicon 218 may be deposited on the gate oxide layer 216. The gate polysilicon layer 218 may be deposited using low pressure chemical vapor deposition (LPCVD). In a preferred embodiment, the gate polysilicon layer 218 may be deposited in an amorphous state. Other deposition techniques may also be used. The thickness of the gate polysilicon layer 218 may be substantially 2000 Angstroms. However, the actual thickness of the gate polysilicon layer 218 may be more or less than 2000 Angstroms.

A blanket P+ gate implant and a masked N+ gate implant may be performed in the gate polysilicon layer 218. Ion implantation may be employed for both implants. Other doping methods that are compatible with the gate polysilicon layer 218 may also be used. The P+ gate implant may form the P-channel device, while the N+ gate implant may form the N-channel device in the gate polysilicon layer 218.

A layer of nitride 220 is then deposited on the gate polysilicon layer 218. The nitride layer 220 may be deposited using plasma-enhanced chemical vapor deposition (PECVD). However, other deposition techniques may be used, such as high-density plasma chemical vapor deposition (HDPCVD). The nitride layer 220 may be substantially 1750 Angstroms thick. However, the actual thickness of the nitride layer 220 may be more or less than 1750 Angstroms.

In addition, an oxide (not shown) may be deposited on the nitride layer 220. If the photoresist is removed prior to etching the gate polysilicon layer 218 (as described below with reference to FIG. 4), the oxide layer may prevent the nitride layer 220 from being etched when the gate polysilicon layer 218 is etched.

FIG. 4 shows the SOI device structure 100 during additional stages of processing according to an exemplary embodiment. An active area masking cut and etch may be performed to remove unwanted nitride and polysilicon regions. A photoresist 222 with the pattern to be etched may be placed on the nitride layer 220. The nitride layer 220 may be etched using a dry etch process, such as reactive ion etch (RIE). However, other etching methods may be used. The photoresist may be removed and the wafer cleaned after etching the nitride layer 220.

The gate polysilicon layer 218 may then be etched using a dry etch process or other compatible etching method. The etching of the nitride layer 220 and the gate polysilicon layer 218 may be performed such that the gate polysilicon layer 218 and the nitride layer 220 are located substantially above both the p-well region 212 and the n-well region 214 in the device silicon layer 206.

FIG. 5 shows the SOI device structure 100 during additional stages of processing according to an exemplary embodiment. A body tie implant mask may be placed on the gate oxide layer 216. A p-type body tie implant 224 may be performed in the device silicon layer 206 on both sides of the gate polysilicon and nitride layers 218, 220. The nitride layer 220 and the gate polysilicon layer 218 may be located substantially above the p-well region 212 of the device silicon layer 206 acting to shield the p-well region 212 from the body tie implant 224. Ion implantation may be employed for the body tie implant 224. Other doping methods that are compatible with the device silicon layer 206 may also be used.

The body tie implant 224 may raise the doping level in the device silicon layer 206 forming the body tie 114 (as seen in FIG. 1). The doping level may be selected to prevent the N+ source 108 from extending completely through the body tie 114. The body tie 114 may connect the p-well region 212 under the gate 106 to the P+ body contact 116.

A substantially similar n-type body tie implant may be performed to enhance the body tie doping for the P-channel device as well. Typically an n-type body tie may be performed as a blanket implant as long as the masked p-type implant dose is increased to compensate for this additional n-type doping in the p-well region 212.

Figure 6:
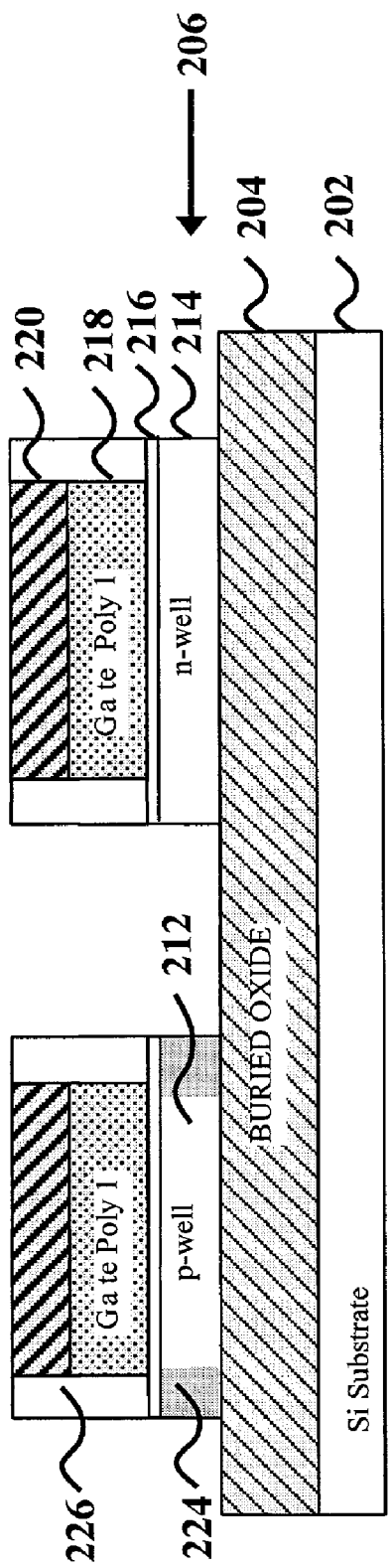

FIG. 6 shows the SOI device structure 100 during additional stages of processing according to an exemplary embodiment. An oxide layer may be deposited on the gate oxide layer 216 and etched back to form body tie spacers 226. The body tie spacers 226 may be deposited using PECVD; however, other deposition methods may be used.

After the body tie spacers 226 are formed, the gate oxide layer 216 and the device silicon layer 206 may be etched down to the buried oxide layer 204, leaving the gate oxide layer 216 and the device silicon layer 206 remaining substantially in the p-well and n-well regions 212, 214 of the device silicon layer 206. The body tie spacers 226 may be located substantially on the gate oxide layer 216, adjacent to each side of the gate polysilicon and nitride layers 218, 220.

Figure 7:
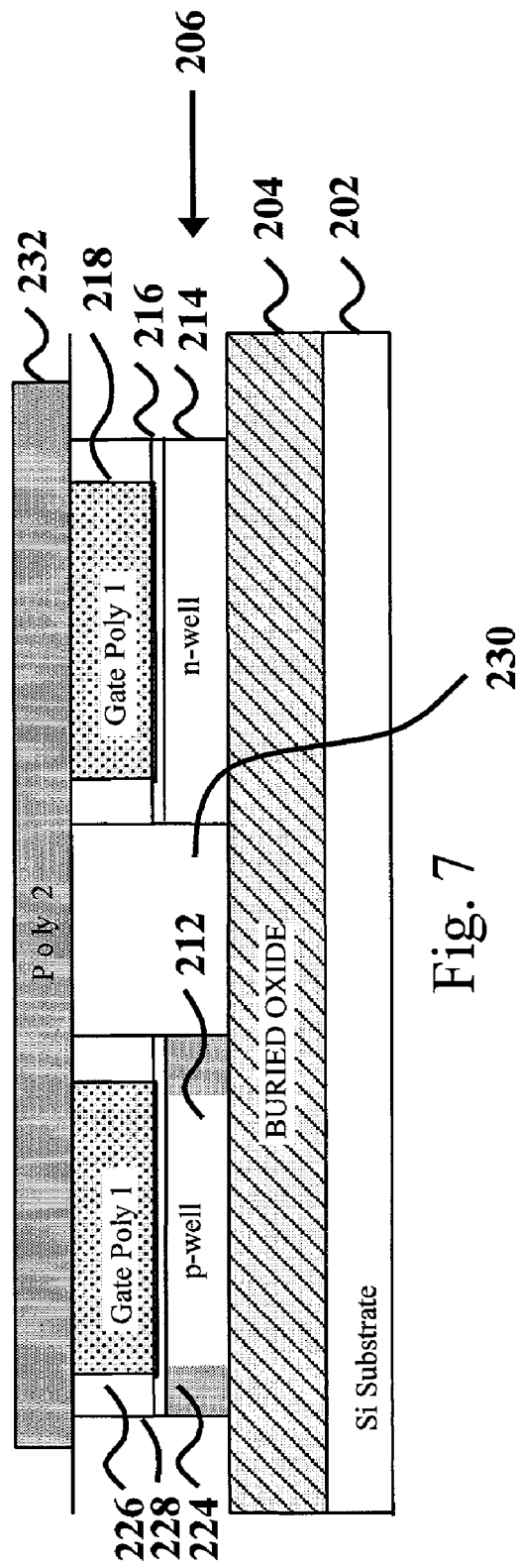

FIG. 7 shows the SOI device structure 100 during additional stages of processing according to an exemplary embodiment. A high temperature gate dopant drive cycle may be performed to provide uniformity in the dopant. For example, a gate drive cycle of substantially 850 degrees Celsius for approximately 60 minutes may be sufficient to flatten the implanted doping profiles in the gate polysilicon layer 218. This drive cycle may prevent non-uniform dopant distributions in the gate polysilicon layer 218 from causing non-uniform oxidation of the polysilicon gate edges through the body tie spacers 226.

Sidewall 228 may be formed by oxidation. The thickness of the sidewalls 228 may be substantially 65 Angstroms. While the thickness of the sidewalls 228 may be varied from 65 Angstroms, the sidewalls 228 should be of sufficient thickness to passivate the etched silicon surfaces prior to field oxide deposition that follows.

A shallow trench isolation (STI) field oxide layer 230 may be deposited and annealed. Planarization may then be performed to provide a flat surface on the wafer. Chemical mechanical planarization (CMP) is performed in an exemplary embodiment, but other planarization techniques may also be employed.

After planarization, the nitride layer 220 may be removed using etching that is selective to the field oxide layer 230 and the gate polysilicon layer 218. Prior to removing the nitride layer 220, the body tie spacers 226 and the field oxide layer 230 may be etched such that the body tie spacers 226 and the field oxide layer 230 are substantially even with the top of the gate polysilicon layer 218.

A second polysilicon layer 232 may be deposited. The second polysilicon layer 232 may be deposited using LPCVD. In a preferred embodiment, the second polysilicon layer 232 may be deposited in an amorphous state. Other deposition techniques may also be used. The second polysilicon layer 232 may be substantially 1500 Angstroms thick However, the actual thickness of the second polysilicon layer 232 may be more or less than 1500 Angstroms.

The second polysilicon layer 232 may be cut and etched along with the gate polysilicon layer 218 to form the gate 106. (See FIG. 1) The gate 106 may be shaped such that the p-well region of the gate 106 is located between the N+ drain 102 and the N+ source 108 and the n-well region of the gate 106 is located between the P+ drain 104 and the P+ source 110. In addition, the second polysilicon layer 232 may extend onto the surrounding field oxide layer 230 to provide interconnection between transistors and contacts.

Figure 8:
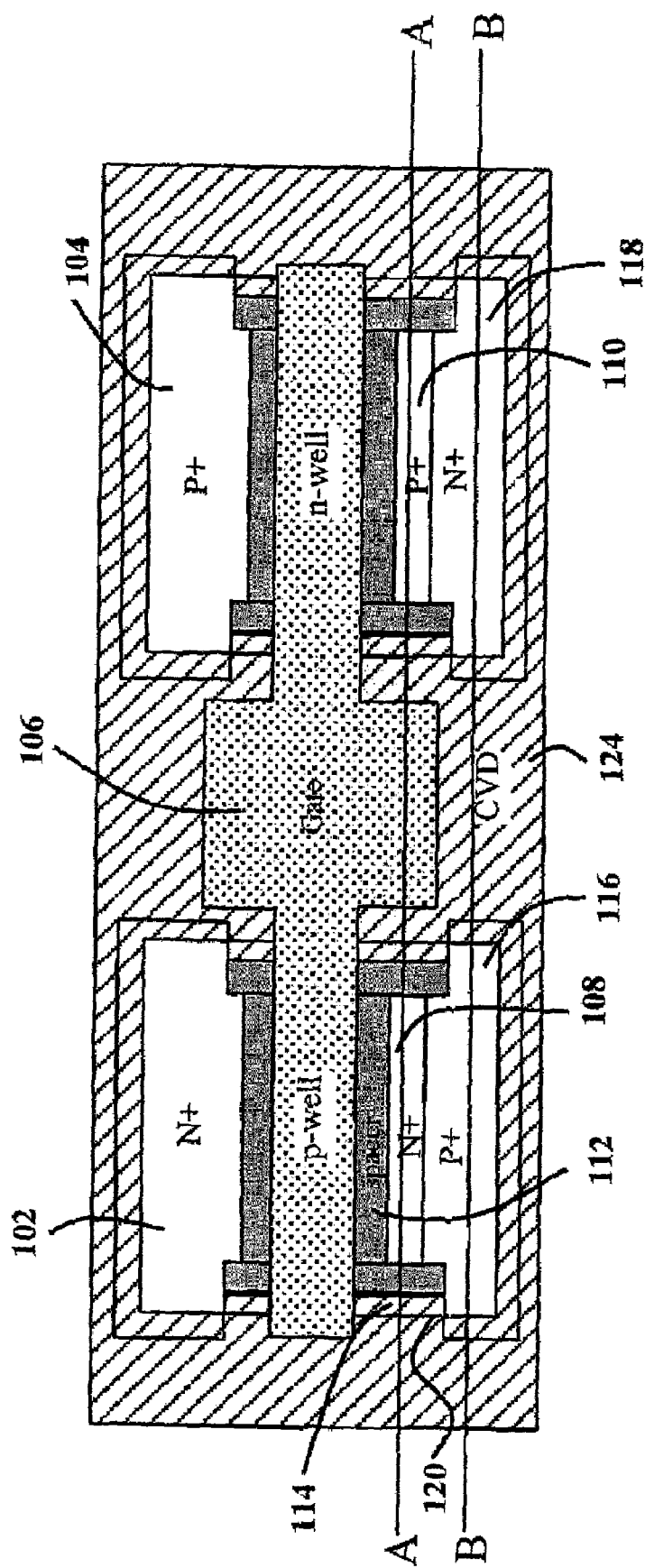
Figures 8A, 8B:
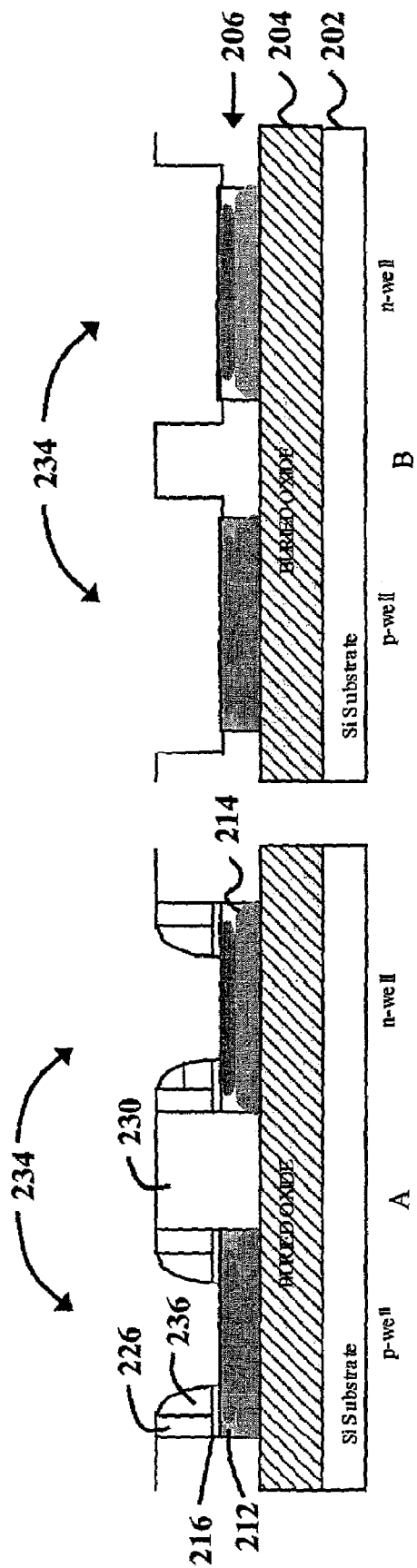

FIG. 8 shows a plan view of the SOI device structure 100 during additional stages of processing according to an exemplary embodiment. FIG. 8a shows a cross sectional view along line A—A as shown in FIG. 8. FIG. 8b shows a cross sectional view along the line B—B as shown in FIG. 8.

Gate edge profile adjustment implants 234 may be performed in the p-well region 212 and the n-well region 214 in the device silicon layer 206. The implants 234 may be performed using ion implantation; however, other implant techniques may also be employed. The dose and the beam current of the implants 234 may be a function of the thickness of device silicon layer 206 and the width of the conduction region. The implant parameters may be selected to create a resistive connection along the edges of the active areas of the SOI device structure 100. The gate edge profile adjustment implants 234 may be used to create a conduction path from the device channel to the body tie 114 connection.

The gate spacers 236 may be deposited and etched. The gate spacers 236 located along the active area edge may be removed with a masked selective etch to increase density. Using oxide or nitride as the gate spacer material may simplify gate spacer removal, depending upon etch capability.

Figure 9:
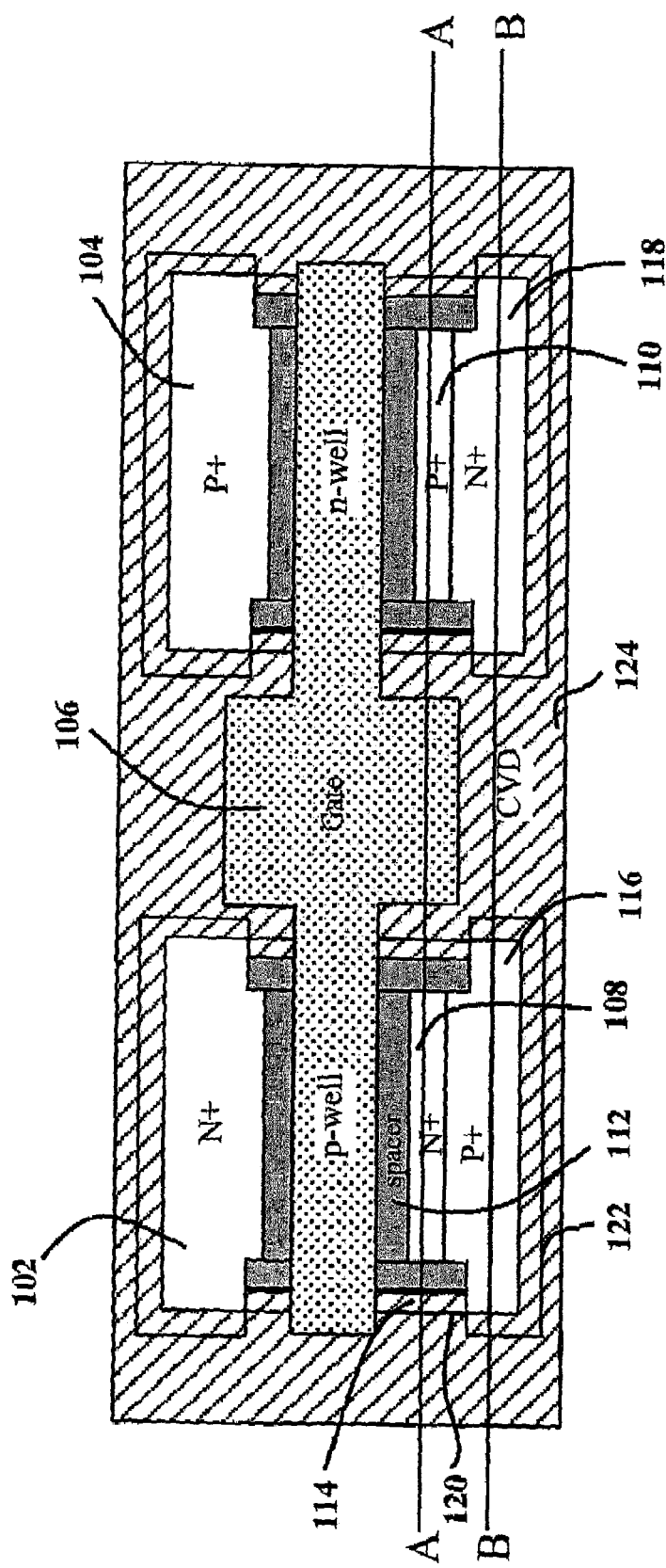
Figures 9A, 9B:
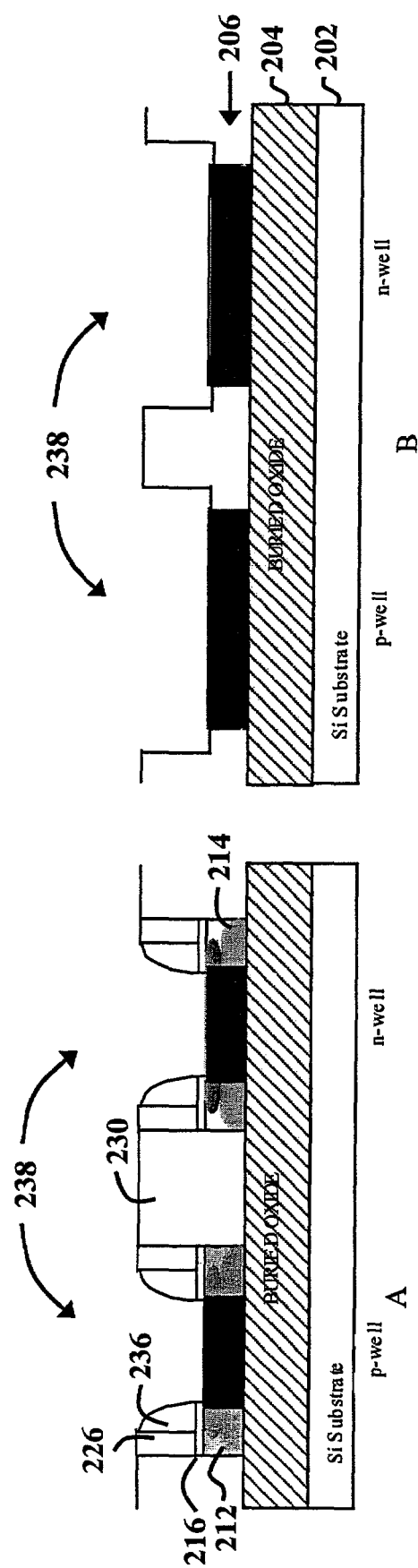

FIG. 9 shows a plan view of the SOI device structure 100 during additional stages of processing according to an exemplary embodiment. FIG. 9a shows a cross sectional view along line A—A as shown in FIG. 9. FIG. 9b shows a cross sectional view along the line B—B as shown in FIG. 9.

Additional N+ and P+ implants 238 may be performed in the device silicon layer 206. The implants 238 may be performed using ion implantation; however, other implant techniques may also be employed. An N+ implant may be performed substantially between to the gate spacers 236 in the p-well region 212 of the device silicon layer 206 forming the N+ drain 102 and the N+ source 108. A P+ implant may be performed substantially between the gate spacers 236 in the n-well region 214 of the device silicon layer 206 forming the P+ drain 104 and the P+ source 110.

In addition, a P+ implant may be performed substantially adjacent to the N+ source 108 forming the P+ body contact 116. The body tie 114 connects the p-well region 112 of the device silicon layer 206 with the P+ body contact 116. Furthermore, an N+ implant may be performed substantially adjacent to the P+ source 110 forming the N+ body contact 118. The body tie 114 connects the n-well region 114 of the device silicon layer 206 with the N+ body contact 118.

Figure 10:
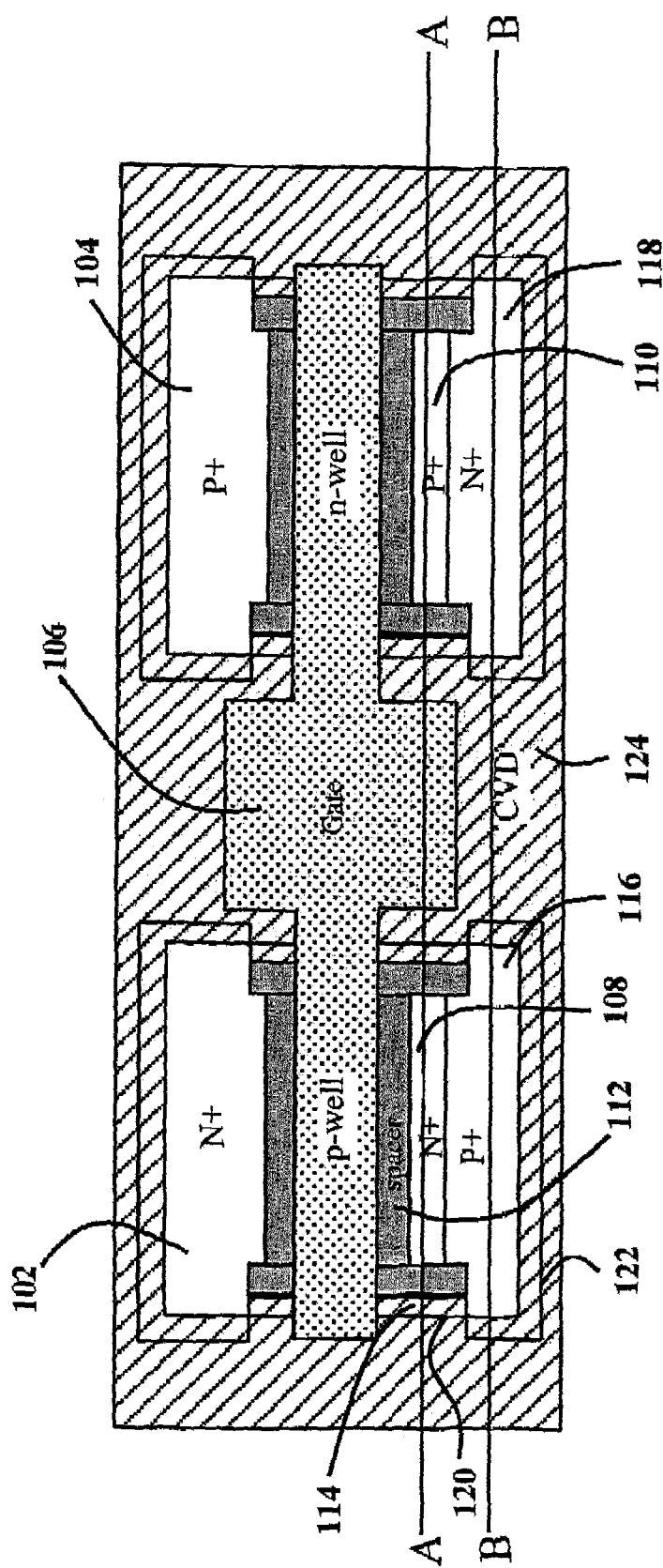

FIG. 10 shows a plan view of the SOI device structure 100 during additional stages of processing according to an exemplary embodiment. FIG. 10a shows a cross sectional view along line A—A as shown in FIG. 10. FIG. 10b shows a cross sectional view along the line B—B as shown in FIG. 10.

Thermal annealing may be performed with a rapid thermal anneal tool (RTA) in the source and drain region to activate the implants, as well as repair any damage to the device surface due to the implants. A standard self-aligned silicide 240 may then be formed on the SOI device structure 100 as a low resistance layer.

Figure 11:
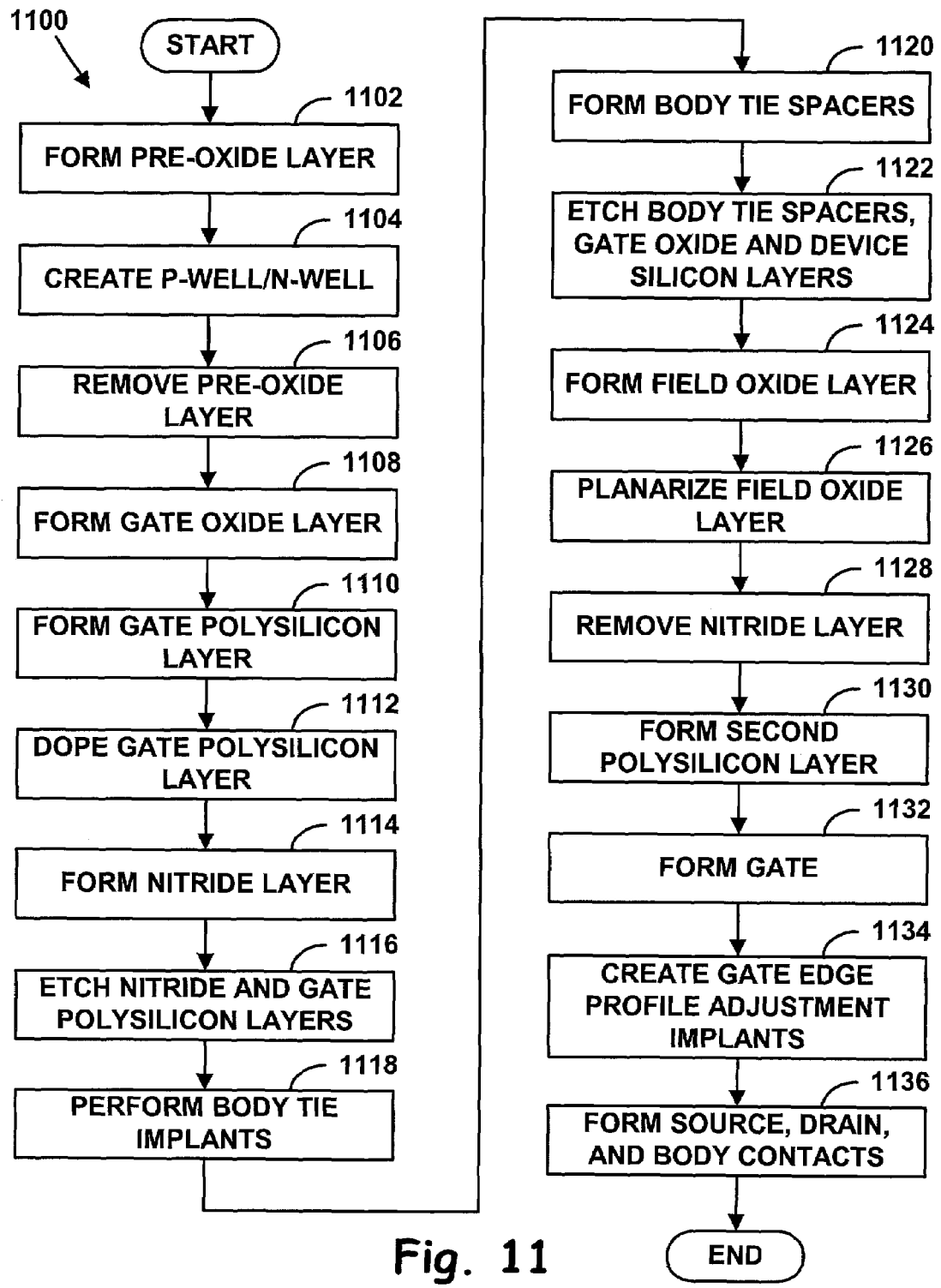
FIG. 11 is a flow diagram illustrating a method for forming the SOI device structure shown in FIG. 1, according to an exemplary embodiment.

FIG. 11 provides a flow diagram illustrating a method 1100 of forming the SOI device structure 100 according to an exemplary embodiment. Method 1100 summarizes the SABT process described above with reference to FIG. 2 through FIG. 10.

The SABT process 1100 may provide a self-aligned body current conduction path, resulting in a circuit layout that is more area efficient than what has previously been described. By reducing the overall gate area, the speed and yield of the device may be increased. In addition, the SABT process 1100 may minimize the sensitivity of critical device parameters due to misalignment and critical dimension control. The SABT process 1100 may also suppress the parasitic gate capacitance created with standard body tie techniques.

Although an exemplary embodiment has been disclosed herein, other variations may be made without departing from the intended scope of the invention. For example, a variety of semiconductor fabrication techniques, including various methods of etching and deposition, may be employed without departing from the scope of the invention itself. The figures are not drawn to scale and are approximations of an exemplary embodiment. For example, corners may be rounded in an exemplary embodiment, rather than straight as depicted. The claims should not be read as limited to the described order or elements unless stated to that effect. Therefore, all embodiments that come within the scope and spirit of the following claims and equivalents thereto are claimed as the invention.

I claim:

1. A self-aligned body tie for a partially depleted silicon-on-insulator device structure, comprising in combination:
   an active region on a silicon-on-insulator substrate;
   an N-channel device and a P-channel device formed on the active region;
   a first body tie providing a conduction path from a p-well region of the N-channel device to a P+ body contact; and
   a second body tie providing a conduction path from an n-well region of the P-channel device to an N+ body contact.

2. The structure of claim 1, wherein a gate is located substantially above the p-well region of the N-channel device and substantially above the n-well region of the P-channel device.

3. The structure of claim 2, wherein the gate extends onto a surrounding field oxide layer to provide interconnection between transistors and contacts.

4. The structure of claim 1, wherein the N-channel device includes an N+ drain, an N+ source, and a gate.

5. The structure of claim 1, wherein the P-channel device includes a P+ drain, the P+ source, and a gate.

6. The device of claim 1, wherein gate spacers are located substantially adjacent to both sides of the p-well region and the n-well region.

7. The structure of claim 6, wherein an N+ drain and the N+ source are located substantially adjacent to the gate spacers on opposite sides of the p-well region.

8. The structure of claim 6, wherein a P+ drain and the P+ source are located substantially adjacent to the gate spacers on opposite sides of the n-well region.

9. The structure of claim 1, wherein the P+ body contact is located substantially adjacent to the N+ source.

10. The structure of claim 1, wherein the N+ body contact is located substantially adjacent to the P+ source.

11. The structure of claim 1, wherein body tie spacers are located substantially adjacent to the P+ body contact and the N+ body contact.

12. The structure of claim 1, wherein the first body tie and the second body tie are located substantially between sidewalls and gate spacers.

13. A self-aligned body tie for a partially depleted silicon-on-insulator device structure, comprising in combination:
   an active region on a silicon-on-insulator substrate;
   an N-channel device and a P-channel device formed on the active region, wherein the N-channel device includes an N+ drain, an N+ source, and a gate, wherein the P-channel device includes a P+ drain, a P+ source, and the gate, and wherein the gate extends onto a surrounding field oxide layer to provide interconnection between transistors and contacts;
   a first body tie providing a conduction path from a p-well region of the N-channel device to a P+ body contact, wherein the P+ body contact is located substantially adjacent to the N+ source, and wherein the first body tie and the N+ source directly contact a buried oxide layer in the active region;
   a second body tie providing a conduction path from an n-well region of a P-channel device to an N+ body contact, wherein the N+ body contact is located substantially adjacent to the P+ source, and wherein the second body tie and the P+ source directly contact the buried oxide layer in the active region; and
   wherein gate spacers are located substantially adjacent to both sides of the p-well region and the n-well region, wherein the N+ drain and the N+ source are located substantially adjacent to the gate spacers on opposite sides of the p-well region, wherein the P+ drain and the P+ source are located substantially adjacent to the gate spacers on opposite sides of the n-well region,
   wherein body tie spacers are located substantially adjacent to the P+ body contact and the N+ body contact, and wherein the first body tie and the second body tie are located substantially between sidewalls and gate spacers.

* * * * *

UNITED STATES PATENT AND TRADEMARK OFFICE
CERTIFICATE OF CORRECTION

| | | |
|---|---|---|
| PATENT NO. | : 6,960,810 B2 | Page 1 of 1 |
| APPLICATION NO. | : 10/158603 | |
| DATED | : November 1, 2005 | |
| INVENTOR(S) | : Paul Fechner | |

It is certified that error appears in the above-identified patent and that said Letters Patent is hereby corrected as shown below:

Col. 7, Line 7 In claim 1, line 7, after "...P+ body contact;" please add --, wherein the first body tie and an N+ source of the N-channel device directly contact a buried oxide layer in the active region; --.

Col. 7, Line 11 In claim 1, line 11, after "...N+ body contact." please add --, wherein the second body tie and a P+ source of the P-channel device directly contact the buried oxide layer in the active region. --

Signed and Sealed this

First Day of May, 2007

JON W. DUDAS
*Director of the United States Patent and Trademark Office*